United States Patent [19]
Tehrani et al.

[11] Patent Number: 5,734,606
[45] Date of Patent: Mar. 31, 1998

[54] MULTI-PIECE CELL AND A MRAM ARRAY INCLUDING THE CELL

[75] Inventors: Saied N. Tehrani, Tempe; Eugene Chen, Gilbert; Ronald N. Legge, Scottsdale; Xiaodong T. Zhu; Mark Durlam, both of Chandler, all of Ariz.

[73] Assignee: Motorola, Inc., Schaumburg, Ill.

[21] Appl. No.: 767,240

[22] Filed: Dec. 13, 1996

[51] Int. Cl.⁶ .................................................. G11C 11/15
[52] U.S. Cl. .................................... 365/173; 365/171
[58] Field of Search ............................ 365/158, 171, 365/173, 97, 130; 360/113

[56] References Cited

U.S. PATENT DOCUMENTS 5,432,734  7/1995  Kawano et al. ..................... 365/158

*Primary Examiner*—Joseph A. Popek
*Attorney, Agent, or Firm*—Eugene A. Parsons

[57] ABSTRACT

New types of memory cell structures (20, 40) for a magnetic random access memory are provided. A memory cell (20, 40) has a plurality of cell pieces (21-24) where digital information is stored. Each cell piece is formed by magnetic layers (27, 28) separated by a conductor layer (29). A word line (25, 41) is placed adjacent each cell piece for winding around cell pieces (21-24) and meandering on a same plane on cell pieces (21-24), for example. The invention attains less power consumption and effective usage for a word current.

10 Claims, 4 Drawing Sheets

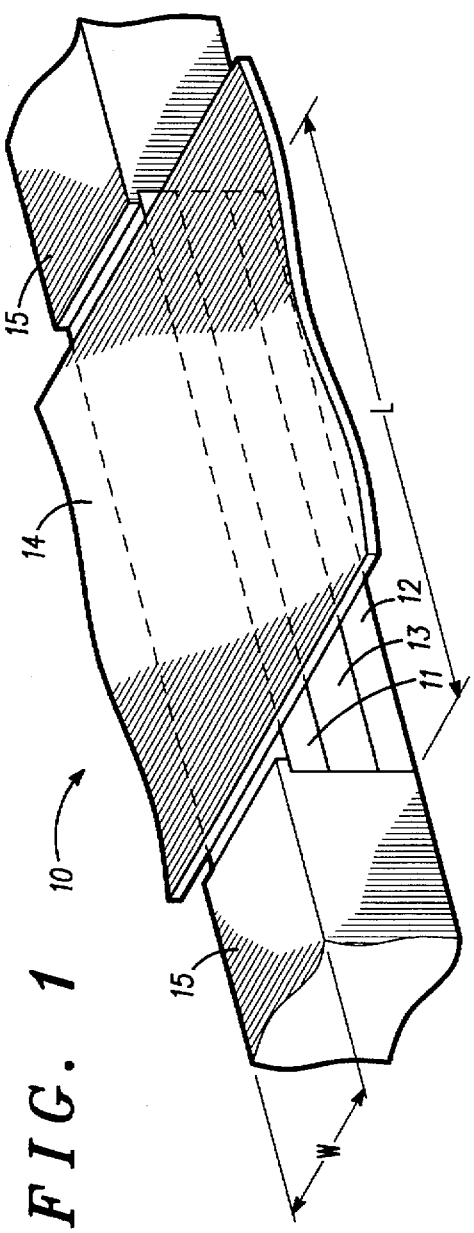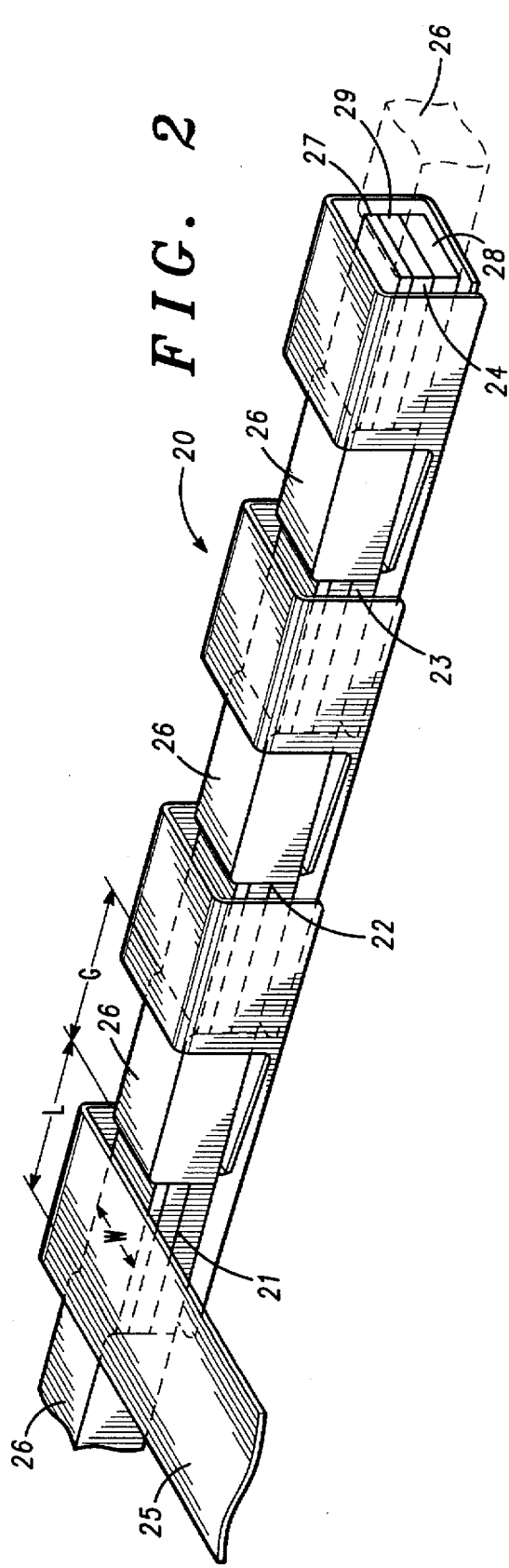

MULTI-PIECE CELL AND A MRAM ARRAY INCLUDING THE CELL

FIELD OF THE INVENTION

The present invention relates to a magnetic random access memory, and more particularly, to a memory cell structure of a magnetic random access memory.

BACKGROUND OF THE INVENTION

A magnetic random access memory (MRAM) consists of a plurality of memory cells arrayed on intersections of word lines and sense lines, each memory cell typically having two magnetic layers separated by a conductive or insulating layer. Structures of MRAMs are disclosed in copending applications bearing Ser. No. 08/553,933, titled "FERROMAGNETIC GMR MATERIAL AND METHOD OF FORMING AND USING", filed Jun. 6, 1995, and bearing Ser. No. 08/554,136, titled "GMR MATERIAL AND METHOD OF FORMING AND USING", filed Jun. 6, 1995, which are hereby incorporated by reference herein.

FIG. 1 shows a perspective view of a typical magnetic memory cell 10 used in the MRAM. Memory cell 10 has a first magnetic layer 11 and a second magnetic layer 12 separated by a conductive layer 13. Layers 11 and 12 utilize magnetic material such as NiFeCo, and conductive layer 13 utilizes, for example, Copper (Cu). The three layers 11, 12, and 13 together form a giant magneto-resistive (GMR) material. A word line 14, which carries a word current, is placed adjacent first layer 11 in order to provide the GMR material with a magnetic field generated by the word current. A sense line 15, which carries a sense current, is connected to the GMR with an ohmic contact to sense a magnetic resistance.

Digital information is represented as a direction of magnetic vectors in magnetic layers 11 and 12, and the information indefinitely remains in a given state until the information is intentionally changed by an opposite magnetic field over a threshold level. In order to write or change a state in memory cell 10, a total magnetic field generated by the word current and the sense current is applied to memory cell 10 that is sufficient to switch the direction of the magnetic vectors in magnetic layers 11 and 12. To read the state in memory cell 10, a voltage on sense line 15 is compared with a reference voltage by a comparator (not shown) and an output voltage is provided as a digital information stored in the memory cell.

When the voltage on sense line 15 is compared with the reference voltage, it is desirable that a length (L) along sense line 15 of magnetic layers 11 and 12 is much longer than a width (W) of layers 11 and 12 perpendicular to sense line 15. Because the greater a ratio (L/W) of the length to the width, typically a value more than five, is selected, the higher a cell resistance is appeared in magnetic layers 11 and 12 when a magnetic field is applied to the layers. Accordingly, the higher output voltage can be appeared over the memory cell 10.

However, the higher the cell resistance needed, the more current is required to operate due to the higher switching field of the cell caused by a larger L/W ratio. Generally, a 50 mA or more word current, for example, is applied in the word line. This means that a high current density in the word line is required to apply the magnetic field for appropriately reading and writing a state in the memory cell.

Furthermore, another problem arises when the higher ratio (L/W) of the length (L) to the width (W) is selected. Word line 14 has almost the same width as the length (L) of magnetic layers 11 and 12 along sense line 15. Accordingly, a total word current, which is a product of the width of the word line and the current density in the word line, increases.

Therefore, it is a purpose of the present invention to provide a new and improved memory cell structure used in a MRAM device which attains a low power consumption of the word current.

It is another purpose of the present invention to provide a new and improved memory cell structure used in a MRAM device which effectively utilizes the word current.

It is still another purpose of the present invention to provide a new and improved memory array structure used in a MRAM device.

SUMMARY OF THE INVENTION

This need and others are substantially met through provision of a MRAM cell which has a plurality of cell pieces, a word line and a sense line. Each cell piece, which is formed by magnetic layers separated by a conductor layer, is connected in series with each other piece by the sense line. The word line is placed adjacent magnetic layers of each cell piece where the sense line is crossed over.

BRIEF DESCRIPTION OF THE DRAWINGS

FIG. 1 shows a simplified MRAM cell having a portion of GMR material.

FIG. 2 shows a simplified and enlarged memory cell in accordance with the present invention.

DETAILED DESCRIPTION OF THE PREFERRED EMBODIMENTS

Figure 3:
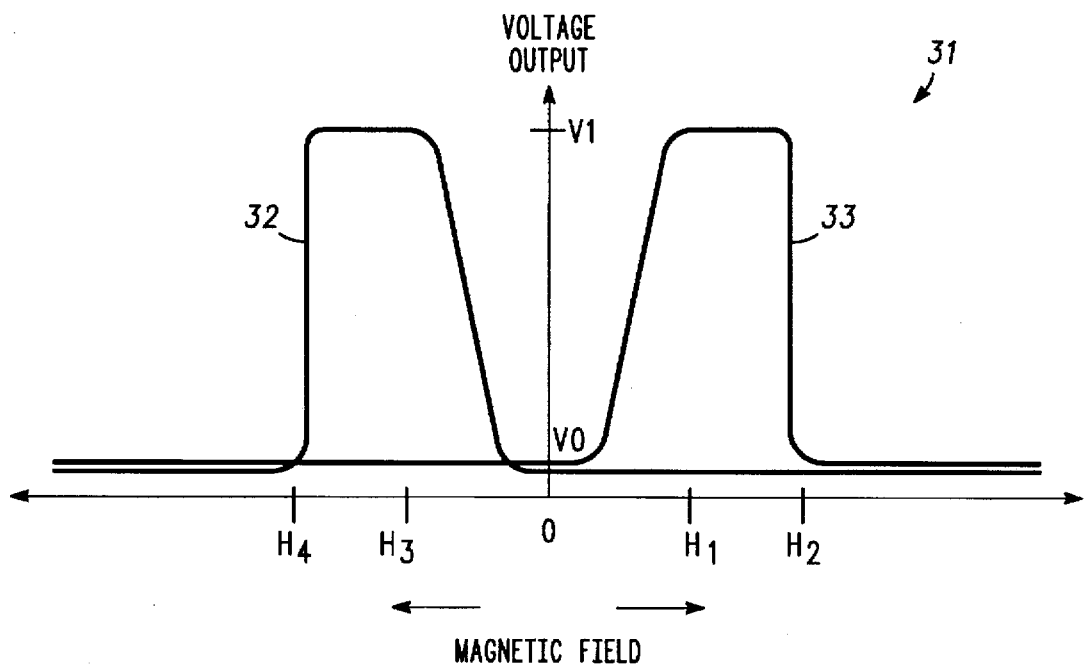
FIG. 3 shows a graph illustrating characteristics of the GMR material shown in FIG. 2.

FIG. 2 shows a simplified and enlarged memory cell 20 in accordance with the present invention. Memory cell 20 is formed by four cell pieces 21–24, a word line 25, and a sense line 26. While memory cell 20, which is formed on a semiconductor substrate (not shown), includes four pieces in these examples it should be understood that memory cell 20 may be comprised of any number of cell pieces greater than one. Each cell piece is made up by at least two magnetic layers 27 and 28 separated by a conductor layer 29, respectively. Word line 25 is wound around cell pieces 21–24 one after another. Sense line 26 is electrically connected in series to cell pieces 21–24 with ohmic contacts.

Each cell piece 21–24 has a length (L) along sense line 26 and a width (W) perpendicular to sense line 26. A ratio R of the length (L) to the width (W) is greater than 1 and less than 5, and typically 1.25 is selected. Each cell piece 21–24 is placed a gap (G) apart from another cell piece, which gap (G) is typically equal to the width (W).

Magnetic vectors in magnetic layers 27 and 28 of cell piece 21 are oriented along a magnetic field generated by a word current in word line 25. The closer to 1 the ratio R is, the easier the magnetic vectors can rotate, that is, less word current is needed to switch a state in cell piece 21. An output voltage appearing on sense line 26, however, decreases as well because the resistance over magnetic layers 27 and 28 decreases.

To reduce this issue, this invention divides one memory cell to four cell pieces 21–24 and serially couples them via sense line 26, thereby the total resistance increases over cell pieces 21–24, while maintaining the same amount of the word current.

FIG. 3 shows a graph 31 illustrating the resistance or voltage output of memory cell 20 (FIG. 2) versus the applied magnetic field or total magnetic field. The abscissa indicates magnetic field direction and strength, that is, the strength either supports or opposes the magnetic vectors of cell 20. The ordinate represents the voltage output of cell 20. A curve 32 indicates the magneto resistance characteristic, via the output voltage, for various magnetic field intensities for one direction of magnetization vectors. A curve 33 indicates the magnetoresistance characteristic, via the output voltage, for the same magnetic field intensities for the opposite direction of magnetization vectors. To the right of zero, curves 32 and 33 indicate the output voltage for magnetic fields that support the vectors of curve 32 and oppose the vectors of curve 33, and magnetic fields to the left of zero support the vectors of curve 33 and oppose the vectors of curve 32. Typically, curves 32 and 33 cross the voltage axis at the same point and have the same minimum values. For the sake of explanation, curve 33 is shifted vertically a slight amount to show the differences between the curves.

At zero applied field, the voltage output ($V_0$) of cell 20 is approximately the same regardless of the magnetization vector direction. As the field increases from zero to $H_1$, curve 33 shows the voltage output of cell 20 having vectors that are opposed by the total magnetic field, and curve 32 shows the voltage of cell 20 having vectors that are supported by the magnetic field. At magnetic field intensity of $H_1$, the vectors in memory cell 20 rotate and indicate the output voltage $V_1$. As the total magnetic field intensity increases between $H_1$ and $H_2$, the magnetic vectors of memory cell 20 continue to rotate and snap to the other direction near a field intensity of $H_2$. Near $H_2$, the vectors of memory cell 20 snap to the opposite direction and the resistance decreases for values of $H_2$ and above. Similarly, the output voltage for an opposite direction total magnetic field is shown between zero and $H_3$ to $H_4$.

Figure 4:
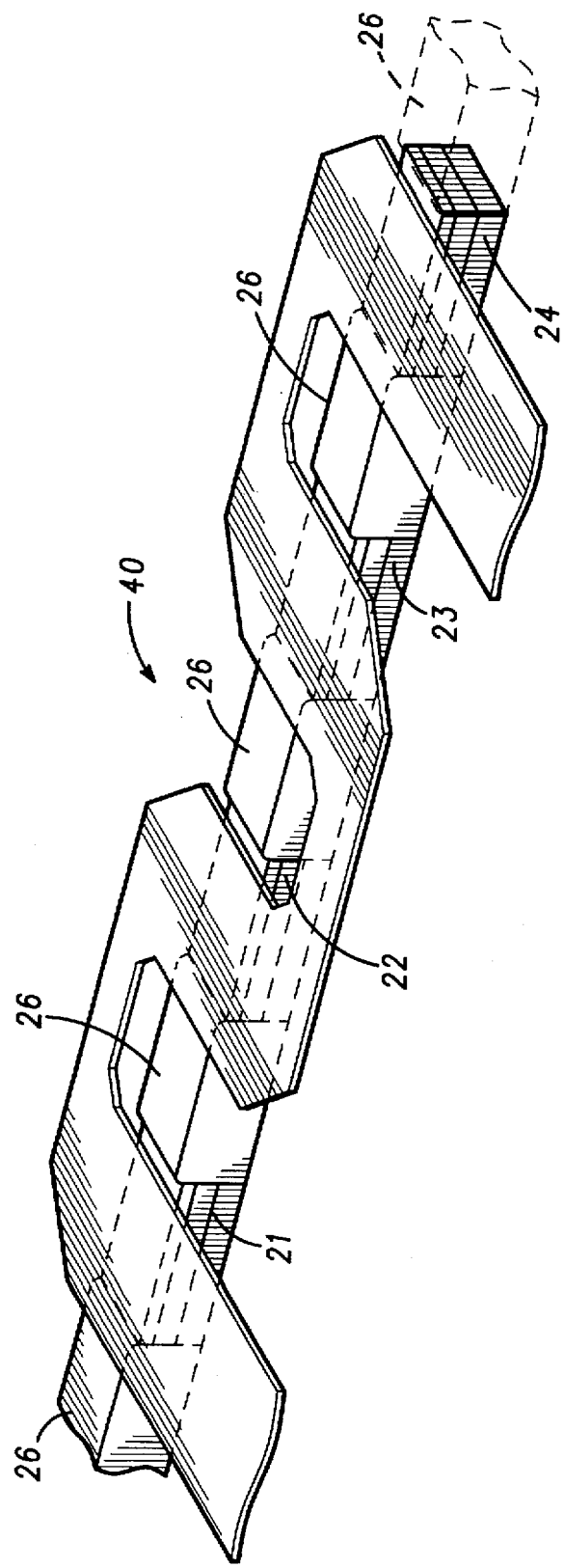
FIG. 4 shows another simplified and enlarged memory cell in accordance with the present invention.

FIG. 4 shows another simplified and enlarged memory cell 40 in accordance with the present invention. Elements of FIG. 4 that have the same reference numbers as FIG. 2 are the same or equivalent as the corresponding FIG. 2 elements. Memory cell 40 has the same structure as memory cell 20 in FIG. 2 except for a word line 41. Memory cell 40 is formed by four cell pieces 21–24, a word line 41, and sense line 26. Each cell piece is located at the same interval distances. Word line 41 is formed on the same plane and meanders on top of cell pieces 21–24. Sense line 26 is electrically connected with ohmic contacts to cell pieces 21–24 in series and crosses over word line 41 on each cell piece. Memory cell 40 has the same characteristics shown in FIG. 3 as memory cell 20. Memory cell 40 can be produced more simply and easily than memory cell 20 because word line 41 is formed on the same plane.

Figure 5:
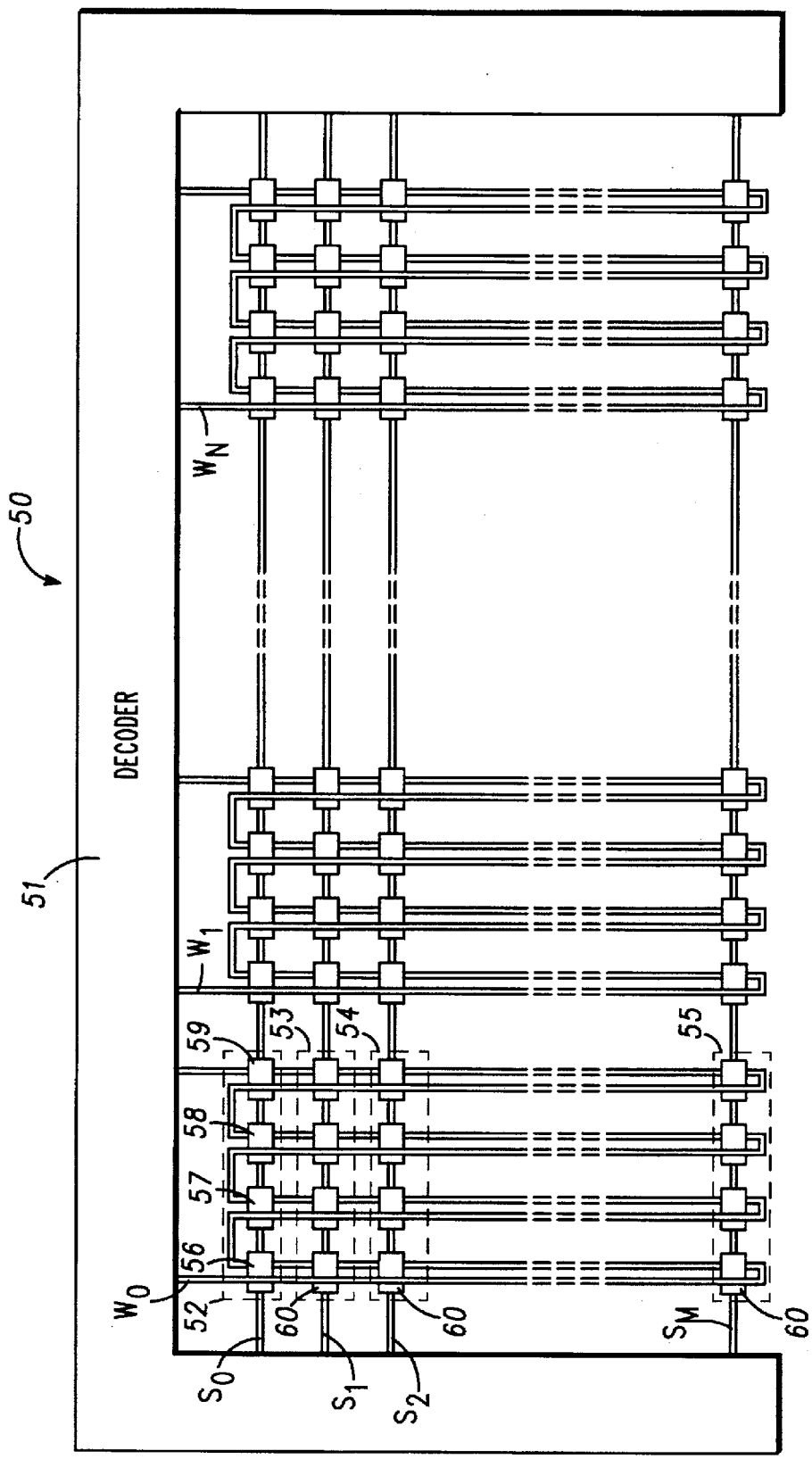
FIG. 5 shows a memory array having memory cells in accordance with the present invention.

FIG. 5 shows a memory array 50 having memory cells in accordance with the present invention. In memory array 50, a plurality of memory cells are disposed in an array on intersections where word lines $W_0$–$W_N$ cross over sense lines $S_0$–$S_M$. Word lines $W_0$–$W_N$ and sense lines $S_0$–$S_M$ are connected to an address decoder 51 by which a memory cell is accessed for reading and writing a state. Memory cells 52–55, for example, are located on intersections of word line $W_0$ and sense lines $S_0$–$S_M$. Memory cell 52 has first, second, third, and fourth cell pieces 56–59, each cell piece comprising two magnetic layers 27 and 28 separated by a conductor layer 29, which is the same structure as cell piece 21 (FIGS. 2 and 4). Each memory cell 53–55 has first, second, third, and fourth cell pieces as well.

Word line $W_0$ is positioned first on the top of each first cell piece 56, 60, etc. in memory cells 52–55, then returns on the bottom of first cell pieces 56, 60, etc. after which it winds over to the tops of the second cell pieces of each of the cells. This wiring is carried out to second, third, and fourth cell pieces 57–59 for word line $W_0$. However, word line $W_0$ may be wired first on the back of second cell piece 57 in memory cells 53–56, then on the top of second cell piece 57. Word line $W_0$ is wound in series around each group of first, second, third, and fourth cell pieces 56–59. In a similar fashion, word lines $W_1$–$W_N$ are also wound around each group of cell pieces.

Thus, a memory cell which is more efficient than prior memory cell is disclosed. The novel memory cell is divided into a plurality of cell pieces, thereby less amount of a word current can be applied to read and write a state in the memory cell and the word current is efficiently used for generating a magnetic field. Furthermore, a novel memory array structure utilizing the memory cell is explained. The MRAM device employing the memory array allows the power consumption to be dramatically reduced.

We claim:

1. A magnetic random access memory cell comprising:

a plurality of cell pieces, each cell piece having a plurality of magnetic layers separated by a conductor layer;

a single word line, placed adjacent each of the cell pieces, for applying a magnetic field created by a word current flowing in the word line to each of the cell pieces; and a sense line, electrically connected to each of the cell pieces in series for sensing a state stored in the memory cell.

2. The magnetic random access memory cell of claim 1 wherein the word line is placed adjacent at least one magnetic layer and another magnetic layer of the cell piece.

3. The magnetic random access memory cell of claim 1 wherein the word line is wound around the cell piece.

4. The magnetic random access memory cell of claim 1 wherein the word line is formed on a same plane and perpendicularly crossed over the sense line on the cell piece.

5. The magnetic random access memory cell of claim 1 wherein the cell piece has a relationship of 1<L/W<5, where L is a length of the cell piece along the sense line and W is a width of the cell piece perpendicular to the sense line.

6. The magnetic random access memory cell of claim 5 wherein each cell piece is placed at least an amount of the width of the cell piece apart from the other cell piece.

7. The magnetic random access memory cell of claim 1 wherein the magnetic layers have different thicknesses.

8. A memory array in a magnetic random access memory device comprising:

a plurality of memory cells arrayed in rows and columns in a matrix, each memory cell having first to Nth cell pieces, each cell piece having a plurality of magnetic layers separated by a conductor layer;

a plurality of word lines, one word line for each column, each word line placed adjacent each of the cell pieces of each memory cell in the column, for applying a magnetic field created by a word current flowing in the word line to the cell pieces; and a plurality of sense lines, each sense line electrically connected to the cell pieces in series for sensing a state stored in the memory cell.

9. The memory array of claim 8 wherein the word line is consecutively formed from adjacent the first cell pieces to adjacent the Nth cell pieces in the memory cell placed on the column line, wherein the word line extends above and below each cell piece of each memory cell in the column line.

10. The memory array of claim 8 wherein the word line is formed on a same plane.

* * * * *